United States Patent [19]

Anderson et al.

[11] Patent Number: 5,587,870
[45] Date of Patent: *Dec. 24, 1996

[54] NANOCRYSTALLINE LAYER THIN FILM CAPACITORS

[75] Inventors: Wayne A. Anderson, Hamburg, N.Y.; Quanxi Jia, Los Alamos, N.M.; Junsin Yi, Amherst; Lin-Huang Chang, Tonawanda, both of N.Y.

[73] Assignee: Research Foundation of State University of New York, Albany, N.Y.

[*] Notice: The term of this patent shall not extend beyond the expiration date of Pat. No. 5,390,072.

[21] Appl. No.: 263,521

[22] Filed: Jun. 22, 1994

Related U.S. Application Data

[63] Continuation-in-part of Ser. No. 945,891, Sep. 17, 1992, Pat. No. 5,390,072.
[51] Int. Cl.⁶ .................................................. H01G 4/10
[52] U.S. Cl. ...................... 361/313; 361/321.5; 29/25.42; 427/79
[58] Field of Search ................................... 361/311, 312, 361/313, 321.1, 321.5, 322; 257/295, 310, 532, 535; 427/79, 80, 81, 126.2, 126.3, 126.5, 419.2, 419.3; 204/192.22; 29/25.42

[56] References Cited

U.S. PATENT DOCUMENTS

| | | | |
|---|---|---|---|
| 4,437,139 | 3/1984 | Howard | 361/313 |
| 4,734,340 | 3/1988 | Saito et al. | 428/698 |
| 4,803,591 | 2/1989 | Miyashita et al. | 361/321.4 |
| 4,873,610 | 10/1989 | Shimizu et al. | 361/313 |
| 4,931,897 | 6/1990 | Tsukamoto et al. | 361/313 |
| 5,173,835 | 12/1992 | Cornett et al. | 361/280 |
| 5,192,871 | 3/1993 | Ramakrishnan et al. | 361/277 |
| 5,390,072 | 2/1995 | Anderson et al. | 361/313 |

OTHER PUBLICATIONS

Shi et al., "High-Performance Barium Titanate Capacitors with Double Layer Structure", Journal of Electronic Materials, vol. 20, No. 11, pp. 939–944, Nov. 1991.

Primary Examiner—Teresa J. Walberg
Assistant Examiner—Gregory L. Mills
Attorney, Agent, or Firm—Crossetta & Associates

[57] ABSTRACT

The invention relates to a method for forming a high capacitance thin film capacitor comprising forming layers of dielectric material in amorphous, nanocrystalline and polycrystalline configuration and arranging the resulting layers between upper and lower electrodes. The invention further comprises dielectric articles such as capacitors formed in accordance with the method of the invention and includes their use in an electronic circuit.

43 Claims, 17 Drawing Sheets

FIG-8

BARIUM TITANATE THIN FILM CAPACITORS

| Layers | Type | Thickness | $\epsilon_r$ | $V_{BD}$ | $\sigma$ | $J(=I/A)$ | $C/A$ |
|---|---|---|---|---|---|---|---|
| P | MIM | 4840 | 330 | $7.2 \times 10^5$ | $9.3 \times 10^{-6}$ | $7.7 \times 10^{-1}$ | $6.0 \times 10^5$ |
| A | MIM | 5000 | 16 | $2.5 \times 10^6$ | $7.7 \times 10^{-11}$ | $6.2 \times 10^{-6}$ | $2.8 \times 10^4$ |
| A/P | MIM | 5050 | 210 | $1.2 \times 10^6$ | $9.1 \times 10^{-11}$ | $7.2 \times 10^{-6}$ | $3.7 \times 10^5$ |
| A/G/P | MIM | 9670 | 130 | $1.8 \times 10^6$ | $8.0 \times 10^{-11}$ | $3.3 \times 10^{-6}$ | $1.2 \times 10^5$ |
| A/G/P | MIM | 4462 | 86 | $1.9 \times 10^6$ | $1.7 \times 10^{-12}$ | $1.6 \times 10^{-7}$ | $1.7 \times 10^5$ |
| A/G/P | MIM | 4190 | 90 | $1.9 \times 10^6$ | $1.3 \times 10^{-7}$ | $1.2 \times 10^{-7}$ | $1.9 \times 10^5$ |
| A/G/P | MIM | 1450 | 66 | $2.1 \times 10^6$ | $9.7 \times 10^{-13}$ | $1.5 \times 10^{-7}$ | $4.0 \times 10^5$ |
| A:H | MIM | 2500 | 25 | — | $1.1 \times 10^{-13}$ | $2.6 \times 10^{-9}$ | $8.9 \times 10^4$ |
| P/SiO$_2$ | MIS | 900 | 16 | $6.0 \times 10^6$ | $2.7 \times 10^{-14}$ | $2.5 \times 10^{-9}$ | $1.3 \times 10^5$ |
| A/RuO$_2$ | MIM | 2460 | 15 | $5.7 \times 10^5$ | $9.8 \times 10^{-14}$ | $1.6 \times 10^{-7}$ | $5.6 \times 10^4$ |
| P/RuO$_2$ | MIM | 2730 | 290 | $3.7 \times 10^5$ | $1.2 \times 10^{-8}$ | $1.7 \times 10^{-3}$ | $9.4 \times 10^5$ |
| A/P/RuO$_2$ | MIM | 2200 | 52 | — | $8.4 \times 10^{-11}$ | $7.6 \times 10^{-6}$ | $2.1 \times 10^5$ |
| P/A/RuO$_2$ | MIM | 1995 | 56 | $1.05 \times 10^6$ | $4.31 \times 10^{-13}$ | $8.4 \times 10^{-8}$ | $2.0 \times 10^5$ |
| A/P/A/RuO$_2$ | MIM | 2280 | 52 | $1.15 \times 10^6$ | $1.0 \times 10^{-13}$ | $1.8 \times 10^{-8}$ | $1.4 \times 10^5$ |

FIG. 18

| SAMPLE | THICKNESS (Å) | $J_L$ (A/cm² @4V) | $V_{BD}$ (v/cm) | $\varepsilon_r$ (1 MHZ) | TAN δ (100 kHz) | σ (Ω·cm)⁻¹ @4V | C/A (PF/cm² @1MHZ) |
|---|---|---|---|---|---|---|---|
| N1 | 2280 | $1.8 \times 10^{-8}$ | $1.15 \times 10^6$ | 52 | -- | $1.0 \times 10^{-13}$ | $1.4 \times 10^5$ |
| N2 | 2600 | $7.8 \times 10^{-10}$ | $7.3 \times 10^5$ | 39 | -- | $5.1 \times 10^{-15}$ | $1.31 \times 10^5$ |
| N3 | 2390 | $3.69 \times 10^{-11}$ | $9.2 \times 10^5$ | 42 | 0.0804 | $2.2 \times 10^{-16}$ | $1.59 \times 10^5$ |
| N4 | 1300 | $5.98 \times 10^{-11}$ | $1.3 \times 10^6$ | 33 | 0.0054 | $1.9 \times 10^{-16}$ | $2.29 \times 10^5$ |
| A/P | 5050 | $7.2 \times 10^{-6}$ | $1.2 \times 10^6$ | 210 | 0.013 | $9.1 \times 10^{-11}$ | $3.7 \times 10^5$ |
| SiO₂ REF | 100–1000 | -- | $1.1 \times 10^7$ | 3.9 | -- | $2.5 \times 10^{-13}$ | $1 \times 10^4$ |

NANOCRYSTALLINE LAYER THIN FILM CAPACITORS

This is a continuation-in-part of U.S. patent application Ser. No. 945,891 filed Sep. 17, 1992, now U.S. Pat. No. 5,390,072 granted Feb. 14, 1995.

The invention relates to thin film dielectric articles comprising a layer of nanocrystalline dielectric material and particularly to high performance nanocrystalline layer containing thin film capacitors having high capacitance per unit area.

BACKGROUND OF THE INVENTION

In forming dielectric articles such as semiconductor integrated circuit devices it is desirable to utilize capacitive elements that have high capacitance in small dimensioned, planar structures to improve the electrical performance and particularly to improve the response of integrated memory circuits. A typical capacitor comprises a pair of electrode layers having dielectric material therebetween. Voltage is applied across the electrode layers and a charge is stored in the capacitor with the amount of charge being storable in the capacitor, e.g. the capacitance, being proportional to the opposing areas of the electrodes and the dielectric constant of the dielectric material.

Capacitance has been also found to be inversely proportional to the thickness of the dielectric material, thus thin film capacitors are generally seen as a preferable means to achieve high performance. Problems still exist however, in optimizing the performance of thin film capacitors, so there is a continuing need to improve electrical properties, such as attaining higher dielectric constants, lowering charge dissipation factors and lowering leakage currents.

European Patent 46,868 discloses fabrication of capacitor structures using dielectrics having high dielectric constants and discusses some of the problems associated therewith, particularly the tendency of dielectric materials having a high dielectric constant to degrade rapidly at higher temperatures and their attendant leakage. The European patent proposes to resolve such problem by forming a capacitor structure that includes dual dielectric layers, comprising a first dielectric layer of silicon nitride or aluminum oxide and a second layer selected from a specific group of selected metal oxides and titanates. Such dual layered dielectric capacitors are said to have high capacitance ($\epsilon/t>0.04$) and satisfactory $E_b$ and dielectric loss.

U.S. Pat. No. 4,734,340 discloses an improved thin film capacitor wherein a particularly thin film dielectric layer, having high dielectric capacitance, is deposited by a sputtering technique and comprises a mixture of tantalum and titanium oxides.

U.S. Pat. No. 4,803,591 discloses an improved capacitor comprising layers of dielectric ceramic compositions of high dielectric constant. The ceramic compositions are characterized as comprising magnesium dioxide together with barium titanate, niobium pentoxide and zinc oxide. The capacitor formed from such ceramic compositions are said to have a high dielectric constant with decreased temperature dependency over a wide temperature range.

U.S. Pat. No. 4,873,610 discloses a dielectric article having a laminate of plural thin film dielectric material layers, comprising a combination of dielectric material layers, that have different temperature characteristics of permittivity. The patent specifies that opposing laminates constitute different dielectric compositions for attaining adjacent layers having different temperature characteristics of permittivity. The reference does not disclosure or infer that layers constituting the same dielectric material can have different temperature characteristics of permittivity.

U.S. Pat. No. 4,931,897 discloses a semiconductor element and method of manufacture wherein a lower electrode, having a polycrystalline silicon film thereon, is treated so that the silicon film comprises an amorphous silicon surface. A thin film of dielectric material is thereafter deposited on the amorphous silicon surface in such manner that the amorphous surface does not recrystallize to a polycrystalline form. The stated objective of the patent is to produce an interface, between the polycrystalline silicon film serving as the lower electrode and the dielectric film, that is flat and uniform to prevent pinholes and electric field concentration. The reference does not disclose the formation of a dielectric film having an amorphous and a polycrystalline layer.

Thus, though the prior art is replete with proposed solutions for manufacture of optimized dielectric articles, such solutions have not sufficiently met the ever increasing demands of the emerging industry for their various uses.

An object of the instant invention is to provide dielectric articles which reduce the leakage problems associated with the use of the various dielectric films.

Another object of the invention is to provide a thin film capacitor that has improved resistance to leakage and has resistance to electric field concentration.

A further object is to provide a method for the formation of thin film dielectric articles that reduces leakage and/or electric field concentration.

A still further object is to provide a thin film capacitor that has improved capacitance per unit film area.

These and other objects of the invention will be apparent from the following recitation.

SUMMARY OF THE INVENTION

The invention comprises a chemically and electronically stable thin film capacitor comprising a layer of nanocrystalline dielectric material, having a high dielectric constant and small current leakage. The capacitor is prepared by a method wherein a nanocrystalline layer of a dielectric material is formed, a polycrystalline film layer of the dielectric material is formed on the nanocrystalline layer, and an amorphous layer of the dielectric material is formed on the polycrystalline layer, the triple layered dielectric material being arranged between upper and lower electrodes.

By the term amorphous layer is meant a layer of dielectric material which has no regular determinate form or structure and essentially no crystallization. By the term polycrystalline layer is meant a layer of dielectric material comprising micro-crystalline to large crystals of dielectric material generally having an average grain size of about $1\times10^{-4}$ cm or larger. By the term nanocrystalline layer is meant a layer of dielectric material comprising small crystals of dielectric material generally having an average grain size of less than about $1\times10^{-4}$ cm.

In one embodiment, a polycrystalline layer of a dielectric is formed on a semiconductor substrate structure that comprises a metal lower electrode, a nanocrystalline layer of the dielectric is formed on the polycrystalline layer, an amorphous layer of a dielectric is formed on the nanocrystalline layer and an upper metal electrode is arranged in communication with the amorphous layer.

In a preferred embodiment, a nanocrystalline layer of a dielectric is formed on a semiconductor substrate structure that comprises a metal lower electrode, a polycrystalline layer of a dielectric is deposited on the nanocrystalline layer, and an upper metal electrode is arranged in communication therewith. In a further preferred embodiment, an amorphous layer of a dielectric material is formed upon the polycrystalline layer, in which instance an upper metal electrode is in communication therewith.

In a preferred embodiment of the invention, the nanocrystalline layer of the dielectric is formed through crystallization of an amorphous layer which is first formed on a semiconductor substrate or metal electrode.

In another preferred embodiment, an amorphous layer of a dielectric is formed on a metal upper electrode, a nanocrystalline layer of the dielectric is formed through crystallization of the amorphous layer, a polycrystalline layer of a dielectric is deposited on the nanocrystalline layer, and is in communication with a semi-conductor substrate comprising a lower metal electrode.

It should be understood that it is contemplated as within the invention to have multiple repeating units comprising the nanocrystalline and polycrystalline layers sandwiched between upper and lower electrodes, forming a capacitor of the invention which has stacked nanocrystalline and polycrystalline repeating units.

The invention includes dielectric articles such as capacitors formed in accordance with the method of the invention and their use in an electronic circuit. Thus, a capacitor element, formed in accordance with the method of the invention, comprises a layered dielectric component having at least one layered nanocrystalline and polycrystalline unit and an amorphous layer of a dielectric material.

Preferably, the polycrystalline layer is formed on a nanocrystalline layer which is in electrical communication with a semiconductor substrate structure comprising a metal lower electrode, and a metal upper electrode is arranged in communication with the surface of an amorphous film for completion of a capacitance circuit with the lower electrode.

Suitable semiconductor substrate structures preferably comprise materials such as Si, SiC, GaAs, CdS, ZnO, ZnS or the like. Most preferred is Si, which has been treated or otherwise prepared to receive a film of a suitable dielectric. Typically, the surface of the substrate is prepared before deposition of the dielectric by cleaning and or otherwise treating the substrate to remove impurities, oxides and the like, and/or to create a smoothly refined surface to avoid pinholes from forming upon deposition of the film.

The upper and lower electrode generally comprise a suitably conductive metallic oxide or metal such as aluminum, copper, gold, silver, platinum, palladium, lead, ruthenium and metallic oxides such as $RuO_2$ and the like that form stable electrodes.

Typical dielectric materials which are preferred for use in the invention are those which comprise $BaTiO_3$, $SrTiO_3$, $KNO_3$, $LiNbO_3$, $Bi_4Ti_3O_{12}$, $PbTiO_3$, $PbZrO_3$, $LaTiO_3$, $PbMgO_3$, $PbNbO_3$, $LaZrO_3$ and the like. A most preferred dielectric material useful in the process of the invention is $BaTiO_3$.

Multiple means can be used for forming the dielectric material in a film. Generally, methods useful in depositing the film include rf magnetron sputtering, vacuum evaporation, laser ablation, metal-organic chemical vapor deposition, E-beam evaporation and the like. A most preferred deposition means is rf magnetron sputtering.

In the method of the invention, a polycrystalline or amorphous film of the selected dielectric is generally formed on a semiconductor substrate comprising the lower electrode, or on an electrode itself which has been arranged on the substrate. It is preferred that an amorphous film of the selected dielectric material be first deposited on a semiconductor substrate and thereafter a nanocrystalline film be formed therefrom by crystallization of the amorphous film. It should be understood that the amorphous film need not be fully crystallized and generally it is adequate to have formation of nanocrystals within an amorphous film matrix.

Preferably, when the film is formed the surface of the substrate and/or electrode is treated, prior to formation, to remove undesirable oxides, impurities and the like. When Si is the substrate of choice and the film is being formed on the substrate, it is typically cleaned with trichlorethylene, acetone, methanol and deionized water prior to formation of a polycrystalline or amorphous film. Native oxide is typically removed from silicon substrates using buffered hydrofluoric acid.

The formation of the amorphous film upon the substrate is generally done at mild temperature conditions, and results in little harm to a cleaned and prepared substrate surface. The amorphous film protects the substrate surface and the subsequent formation of a nanocrystalline film, by crystallization of the amorphous film, generally acts to provide continuing protection of the substrate surface and reduces the incidence of imperfections.

Forming a nanocrystalline and/or polycrystalline layer of dielectric material is typically done at elevated temperatures in order to achieve the desired crystalline film. For example, when depositing $BaTiO_3$ using rf magnetron sputtering deposition for forming a polycrystalline material, the deposition is done at temperatures generally in excess of about 540° centigrade with temperatures exceeding about 1,000° centigrade being operable but not generally preferred. When depositing $BaTiO_3$ using rf magnetron sputtering deposition for forming a nanocrystalline material, or when crystallizing a previously applied amorphous film layer, temperatures generally from about 350° centigrade to about 650° centigrade are preferred.

In general, the higher the temperature of polycrystalline film formation the higher the dielectric constant attained. For example, the rf magnetron sputtering deposition of polycrystalline $BaTiO_3$ on a silicon substrate at temperatures of about 700° Centigrade provides a dielectric constant of about 330 while deposition at about 1,000° centigrade attains significantly higher constants, which may exceed 1,000.

Formation of an amorphous layer, is typically carried out at room temperature or at least below a temperature that may cause significant crystallization of the amorphous layer or recrystallization of any nanocrystalline layer of dielectric material which may have been previously formed. Generally it has been found that deposition below about 540° C. is adequate to assure that crystallization of a previously formed $BaTiO_3$ nanocrystalline layer does not occur. In general, the lower the formation temperature of the amorphous layer the higher the breakdown voltage and the lower the dielectric constant of the dielectric material of a layer.

When forming a polycrystalline layer on a previously formed nanocrystalline layer, consideration should be given to modifications that may result at the boundary of the nanocrystalline layer that subsequently receives a higher temperature deposit of a polycrystalline layer. Typically, when a polycrystalline layer is deposited at higher temperatures on a nanocrystalline layer, some of the nanocrystalline dielectric material is recrystallized forming microcrystalline or larger polycrystalline dielectric material. Such does not generally significantly affect capacitance and/or voltage leakage. The nanocrystalline material that is recrystallized can be compensated for by initially providing a thicker nanocrystalline layer.

The thickness of the dielectric film layers can vary but generally an amorphous layer which is deposited for crystallization to a nanocrystalline layer is from about 100 to about 2,000 angstroms thick. The thickness of an amorphous layer deposited on a polycrystalline layer for completion of the circuitry to an electrode is about 100 to about 2,000 angstroms thick and the polycrystalline layer is from about 400 to about 10,000 angstroms thick. Preferably, the polycrystalline film is formed in a layer from about 1,500 to about 3,500 angstroms, the formed nanocrystalline layer is from about 150 to about 600 angstroms, and the amorphous film is a layer from about 150 to about 600 angsttoms.

We have found that when the layered structure of the invention is utilized, e.g. wherein a nanocrystalline layer of a dielectric material is formed from an amorphous layer, a polycrystalline layer of the same dielectric is deposited thereon and thereafter an amorphous layer is deposited on the polycrystalline layer, that there is a heightening of the synergism which we have found to occur among amorphous and polycrystalline layer depositions, providing even more efficient high capacitance performance than otherwise considered achievable through use of a particular dielectric.

It is widely known that the polycrystalline form of a dielectric provides a high capacitance, but it is also known that such form is susceptible to low voltage breakdown and concomitant leakage. It is also widely known that the amorphous form of a dielectric has a low capacitance but that such form has a high voltage breakdown and resists leakage.

What we have found, is that when amorphous and polycrystalline layers of a dielectric are juxtaposed to form a structure of the invention, that there is synergistic improvement to the voltage breakdown and leakage problems associated with the dielectric; and, when a nanocrystalline layer is interposed between the polycrystalline layer and an electrode forming the structure of the invention, the capacitance and the voltage breakdown level of the resulting double layer is further improved from what would be expected. That is, the operational characteristics of the combined layers do not correspond to their weakest characteristic, nor even correspond to a simple average of the operational characteristics of the three layers. Unexpectedly, we have found that the combined capacitance of the three layers tends to be closer to that of the higher dielectric constant polycrystalline form, while breakdown voltage and concomitant leakage of the combined layers tends to be closer to that of the amorphous layer.

Still further, we have found that a very thin amorphous layer can be used, which significantly increases the breakdown voltage of the combined layer without also significantly reducing the capacitance of the combined layer.

For example, at elevated formation temperatures of about 700° centigrade, a polycrystalline layer formed having a thickness of about 5,000 angstroms of $BaTiO_3$ was found to have a dielectric constant of about 330. An amorphous film of the same dielectric, having a thickness of about 200 angstroms, which is formed at about room temperature was found to have a dielectric constant of about 16. When an amorphous film is formed on a polycrystalline film, in accordance with the invention, the resulting dielectric constant of the double layer was found to be about 210, while the breakdown voltage exceeded $1 \times 10^6$ v/cm and concomitant leakage was found to be not significantly different from the amorphous layer alone.

Further, when a polycrystalline film is interposed between the nanocrystalline and amorphous film, in accordance with the invention, the resulting dielectric constant of the triple layer was found to approach 200, while the breakdown voltage approached $2 \times 10^6$ v/cm and concomitant leakage was found to be not significantly different from the amorphous and polycrystalline layer alone.

Thus, the invention also allows the fabricator to tailor a capacitor to various desirable levels of capacitance, at particular breakdown voltages, through comparative film thickness of the dual layers.

These and other objects, features, aspects and advantages of the invention will become more apparent from the following detailed description of the invention when taken in conjunction with the drawings.

BRIEF DESCRIPTION OF THE DRAWINGS

FIG. 8 comprises tabulated data from thin film capacitors comprising amorphous $BaTiO_3$, polycrystalline $BaTiO_3$, polycrystalline-amorphous $BaTiO_3$ and amorphous-polycrystalline-amorphous $BaTiO_3$ layered metal-dielectric-metal and metal-dielectric-semiconductor-metal structures.

FIG. 18 comprises tabulated data from thin film capacitors comprising a summary of trilayer capacitor characteristics of the invention.

DETAILED DESCRIPTION OF THE INVENTION

Figure 1:
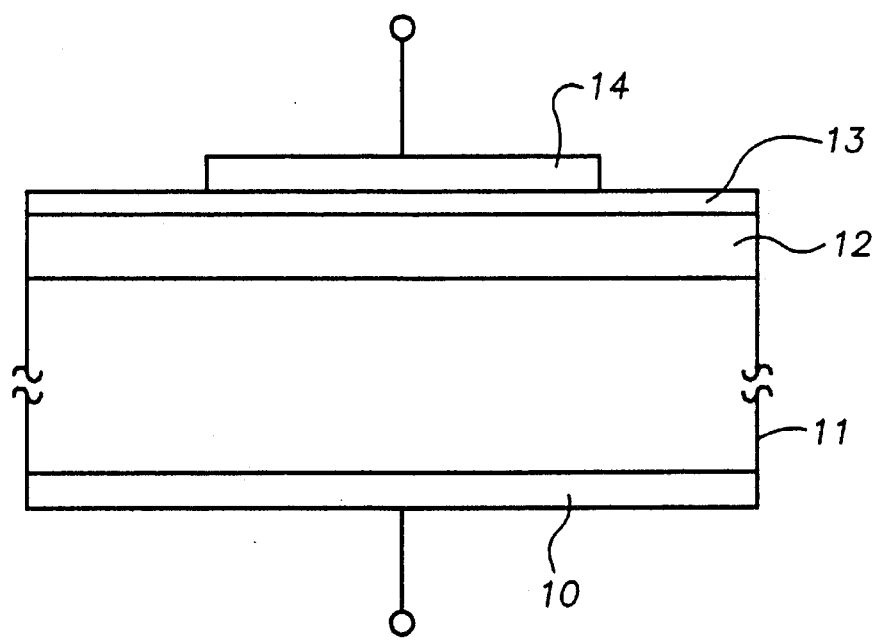
FIG. 1 is a sectional view of a semiconductor capacitive element embodiment having a metal-dielectric-semiconductor-metal structure of the invention.
Figure 1A:
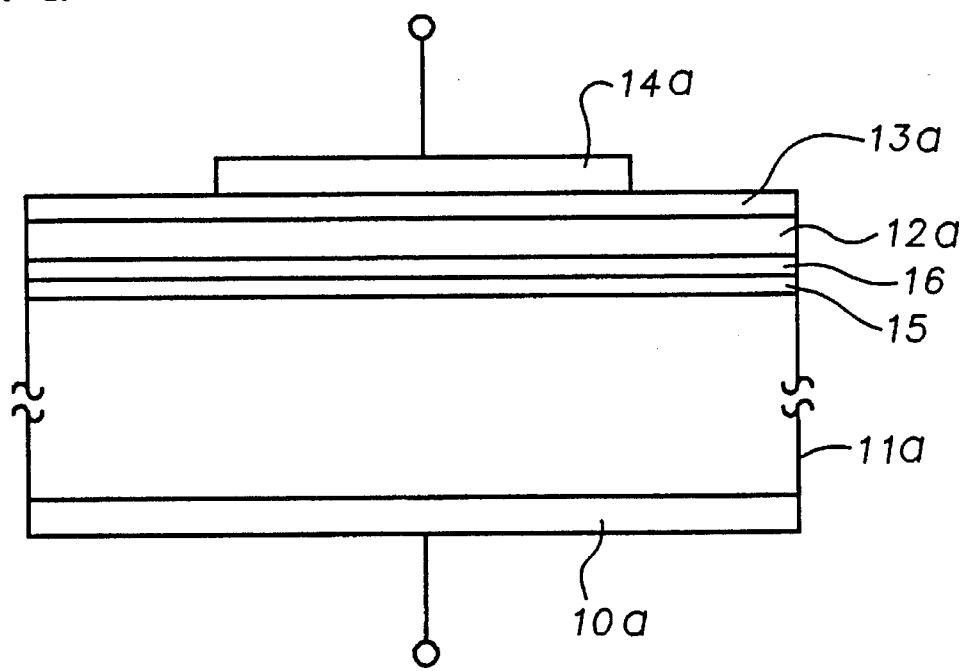
FIG. 1a is a sectional view of another semiconductor capacitive element embodiment having a metal-dielectric-semiconductor-metal structure of the invention.

Referring to the drawings, FIGS. 1 and 1a are sectional views of capacitors configured wherein the components are arranged in a planer metal-dielectric-semiconductor-metal (ohmic) structure. In FIG. 1, the structure comprises a metal lower electrode 10, engaging semiconductor 11. Semiconductor 11 has formed thereon a double dielectric layer, which comprises a thin film polycrystalline layer 12, formed on semiconductor 11, and a thin film amorphous layer 13 which has been formed on polycrystalline layer 12. Engaging amorphous layer 13 is metal upper electrode 14.

In FIG. 1a, the structure comprises a metal lower electrode 10a, engaging semiconductor 11a. Semiconductor 11a has formed thereon three dielectric layers, which comprises a thin film amorphous layer 15 formed on semiconductor 11a, polycrystalline layer 12a which is formed on amorphous layer 15, and a thin film amorphous layer 13a which has been formed on polycrystalline layer 12a. Engaging amorphous layer 13a is metal upper electrode 14a.

Figure 2:
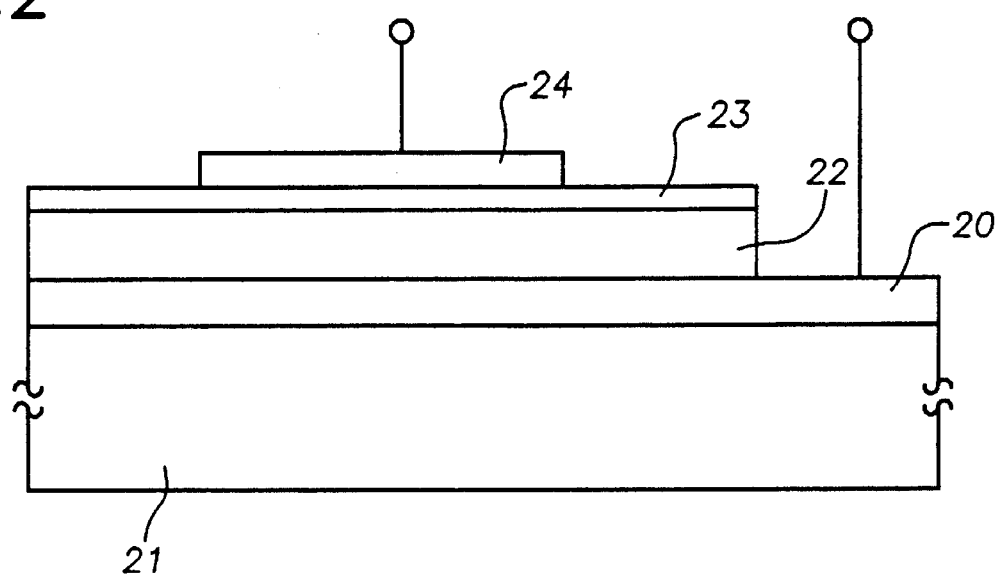
FIG. 2 is a sectional view of a semiconductor capacitive element embodiment having a metal-dielectric-metal structure of the invention.

FIG. 2. is a sectional view of another planer capacitor configuration wherein the components are arranged in a metal-dielectric-metal structure. Therein, the structure comprises metal lower electrode 20, engaging semiconductor 21. Electrode 20 has formed thereon a dual dielectric layer, which comprises a thin film polycrystalline layer 22, formed on electrode 20, and a thin film amorphous layer 23 which has been formed on polycrystalline layer 22. Engaging amorphous layer 23 is metal upper electrode 24.

Figure 9:
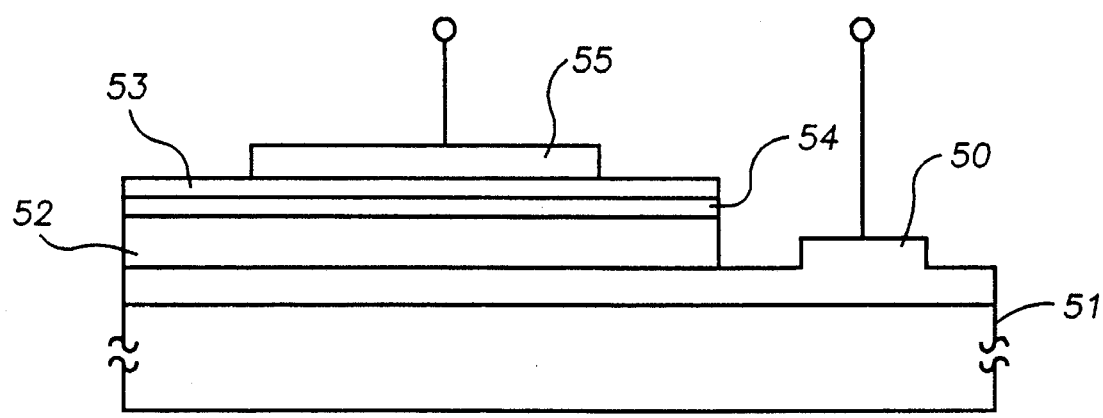
FIG. 9 is a sectional view of a semiconductor capacitive element embodiment having a trilayer metal-dielectric-semiconductor-metal structure of the invention.

FIG. 9. is a sectional view of a planer capacitor configuration of the invention wherein the components are arranged in a metal-dielectric-semi-conductor-metal structure. Therein, the structure comprises metal lower electrode 50, engaging semiconductor 51. Electrode 50 has formed thereon a thin film polycrystalline layer 52, a nanocrystalline thin film layer 54, and a thin film amorphous layer 53. Engaging amorphous layer 53 is metal upper electrode 55.

In a general embodiment of a thin film capacitor process of the invention, a semiconductor substrate, is treated to remove native oxides and cleaned to remove surface impurities. In one embodiment of a metal-dielectric-semiconductor-metal capacitor, a thin film of amorphous dielectric is deposited on the upper surface of a silicon substrate, comprising a metal electrode on its opposite surface, by rf magnetron sputtering from a composite dielectric target. The sputtering is done in an argon/oxygen atmosphere, which may also contain hydrogen, by maintaining the substrate at about or slightly above room temperature. The amorphous film is deposited to a thickness of about 30 to about 300 angstroms. In an embodiment comprising a metal-dielectric-metal capacitor, the metal electrode is formed on the upper surface of the silicon substrate, it is generally cleaned and the amorphous dielectric is deposited as previously described thereon.

The substrate is then heated to a temperature about or a little above the temperature of crystallization of the amorphous dielectric material to a nanocrystalline state. Care should be taken in selecting the temperature, as higher temperatures may cause the amorphous layer to crystalize to a polycrystalline state. Generally, maintaining the substrate within a temperature range of about 400° to about 650° C. for a $BaTiO_3$ amorphous dielectric material deposited on a substrate is sufficient to attain crystallization to the nanocrystalline state.

A thin film of amorphous dielectric can be deposited on the surface of the polycrystalline film, again using rf magnetron sputtering, but, by maintaining the processing temperature at a temperature below which crystallization can occur. The amorphous film is deposited to a thickness of about 150 to about 300 angstroms. The metal upper electrode is then arranged in engagement with the amorphous layer.

When a polycrystalline layer is deposited on a nanocrystalline layer the nanocrystalline layer can be first cleaned as before described. The polycrystalline layer is then deposited on the nanocrystalline layer at the higher temperatures necessary for the larger polycrystallization and generally at least some polycrystallization of the nanocrystals occurs at about the boundary. In an embodiment of the invention, the polycrystalline layer is deposited as a continuation of the deposition of the nanocrystalline layer or vice-versa. In such embodiment, deposition is initiated at a first temperature range, assuring either a nanocrystallization of an amorphous layer, and at a point of desired film thickness the deposition temperature is gradually changed to cause polycrystalline deposition to the desired thickness and thereafter cooled to deposit an amorphous layer. Such gradual change in temperature results in the formation of a gradient layer for example at numeral 16 in FIG. 1a, that comprises nanocrystalline or quasi-amorphous dielectric at a desired thickness. Such gradient layer may be desirable when using a dielectric wherein abrupt change in structure is not wanted.

FIGS. 3–8 provide correlation data relating to various double layer embodiments of the invention. In fabricating the capacitors to obtain the data, silicon semiconductor substrates that were used, were treated with buffered hydrofluoric acid to remove native oxides and cleaned with trichlorethylene, acetone, methanol and deionized water, to remove surface impurities prior to formation of the dielectric film. Metal electrodes were also cleaned.

Figure 3:
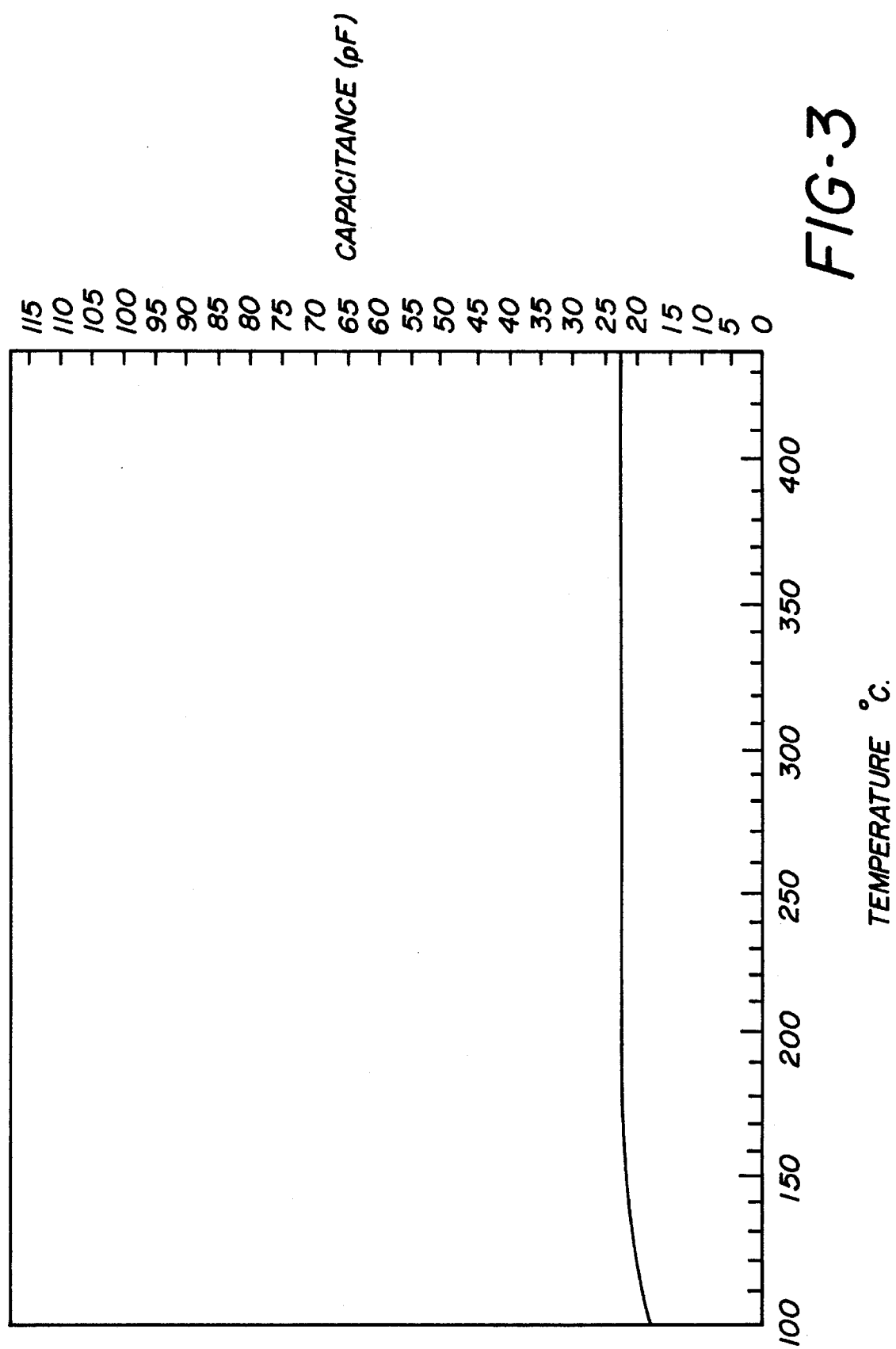
FIG. 3 is a correlation graph, depicting capacitance vs temperature, of a thin film of amorphous $BaTiO_3$ formed by rf magnetron sputtering deposition.
Figure 4:
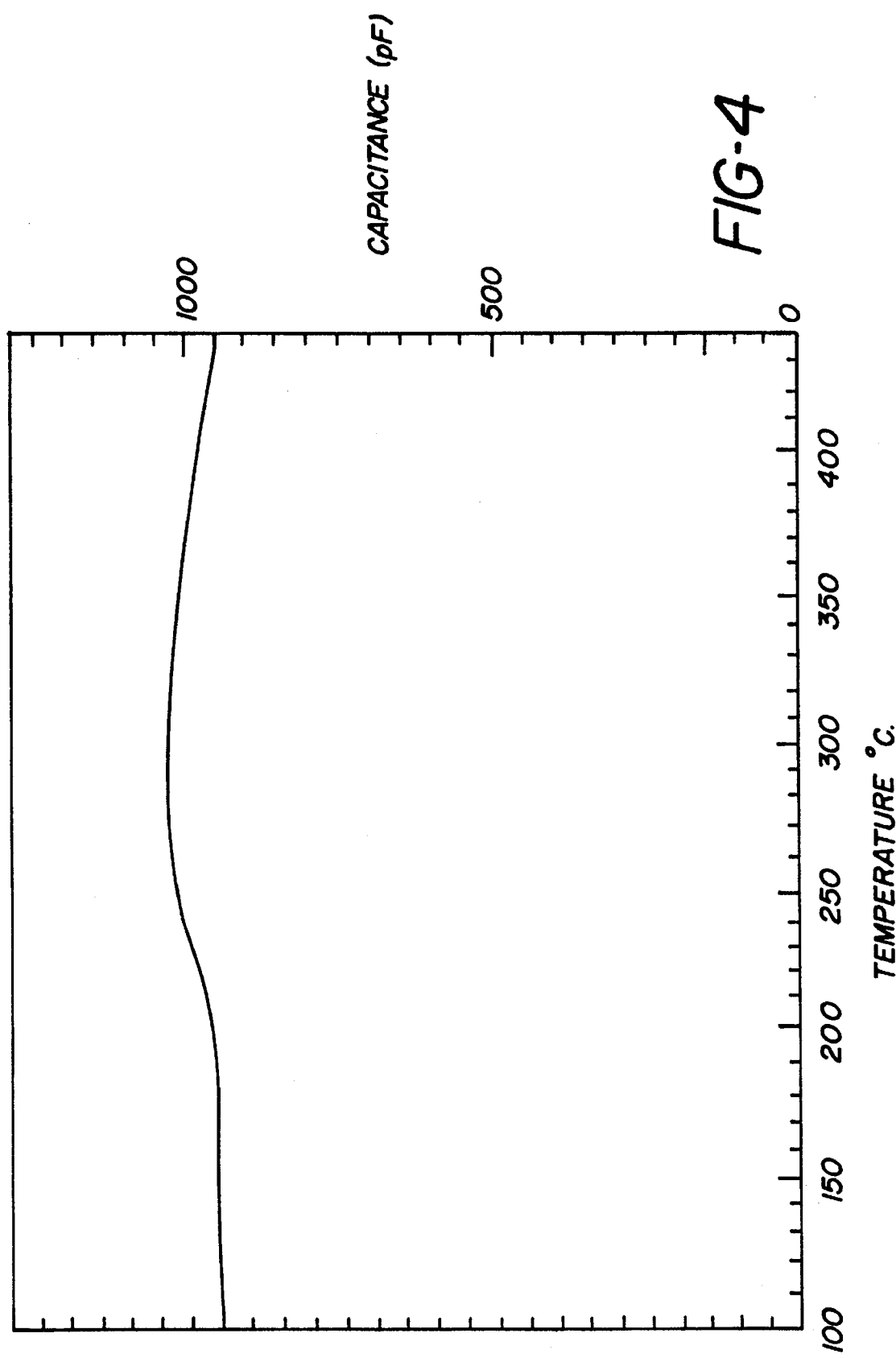
FIG. 4 is a correlation graph, depicting capacitance vs temperature, of a thin film of polycrystalline $BaTiO_3$ formed by rf magnetron sputtering deposition.
Figure 5:
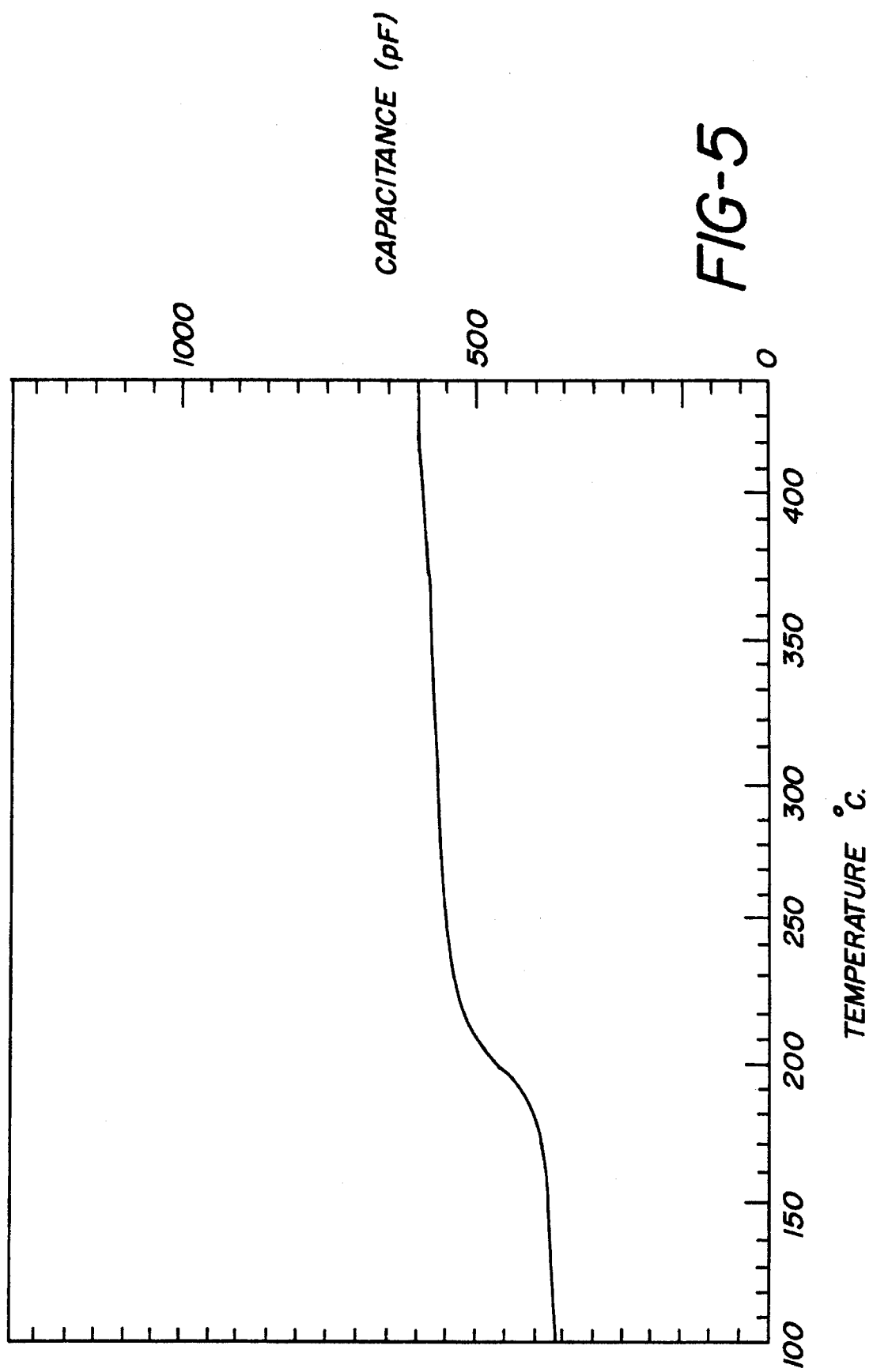
FIG. 5 is a correlation graph, depicting capacitance vs temperature, of a dual thin film containing polycrystalline $BaTiO_3$ layered with a thin film of amorphous $BaTiO_3$, both formed by rf magnetron sputtering deposition.

Metal-dielectric-semiconductor-metal capacitors were fabricated and used to obtain the data for FIGS. 3, 4, 5 and a specifically designated structure of FIG. 8. Metal-dielectric-metal capacitors were fabricated and used to obtain the data for FIGS. 6, 7 and most structures of FIG. 8.

In FIGS. 3–7, for capacitors comprising a film of polycrystalline dielectric, a thin film was deposited on the upper surface of the silicon substrate or metal electrode, by rf magnetron sputtering, from a perpendicularly or parallel arranged composite dielectric target comprising 99.9% pure $BaTiO_3$. The sputtering was at an input power of from 30 to 50 watts, at a total Argon and Oxygen gas pressure of about 20 mTorr and a temperature of from about 540° to about 700° Centigrade. The polycrystalline film was deposited to a thickness of about 5,000 angstroms and the crystalline characteristics thereof were generally confirmed by scanning electron microscopy and X-ray diffraction. Where only a polycrystalline layer was being tested, a metal upper electrode was arranged to engage the polycrystalline film to form the completed capacitor.

In FIGS. 3–7, for capacitors where a double layer was being tested, a thin film of amorphous $BaTiO_3$ was deposited on the surface of the polycrystalline film, again using rf magnetron sputtering, but arranging the composite 99.9% pure $BaTiO_3$ dielectric target parallel to the polycrystalline surface and maintaining the processing temperature at about room temperature in order to avoid recrystallization of the polycrystalline layer. The amorphous film was deposited to a thickness of about 200 angstroms and the amorphous characteristics thereof were generally confirmed by scanning electron microscopy and X-ray diffraction. A metal upper electrode was then arranged to engage the amorphous layer to form the completed capacitor.

In FIGS. 3–7, for capacitors where a single amorphous layer was being tested, a thin film of amorphous dielectric was deposited on the surface of a silicon substrate, or metal lower electrode, by rf magnetron sputtering from a parallel or perpendicular arranged composite dielectric target comprising 99.9% pure $BaTiO_3$. The sputtering was at an input power of from 30 to 50 watts, at a total Argon and Oxygen gas pressure of about 20 mTorr and a temperature maintained at about room temperature. The amorphous film was deposited to a thickness of about 200 angstroms and the amorphous characteristics thereof were generally confirmed by scanning electron microscopy and X-ray diffraction. A metal upper electrode was then arranged to engage with the amorphous layer to form the completed capacitor.

FIG. 3 illustrates the correlation between capacitance and temperature of an amorphous layer of $BaTiO_3$ in a metal-dielectric-semiconductor-metal capacitor. The data demonstrate that though capacitance is maintained essentially constant through the temperature range, it is at a low level, and the breakdown voltage is extremely high at $2.5 \times 10^6$ v/cm.

FIG. 4 illustrates the correlation between capacitance and temperature of a polycrystalline layer of $BaTiO_3$ in a metal-dielectric-semiconductor-metal capacitor. The data demonstrate that though capacitance varies throughout the temperature range, it is maintained at an extremely high level, and breakdown voltage is lower at $7.2 \times 10^5$ v/cm.

FIG. 5 illustrates the correlation between capacitance and temperature of a dual layer comprising polycrystalline $BaTiO_3$ covered by a layer of amorphous $BaTiO_3$ in a metal-dielectric-semiconductor-metal capacitor. The data demonstrate that though capacitance varies throughout the temperature range, it is maintained at a high level, and breakdown voltage is an acceptable $1.2 \times 10^6$ v/cm.

Figure 6:
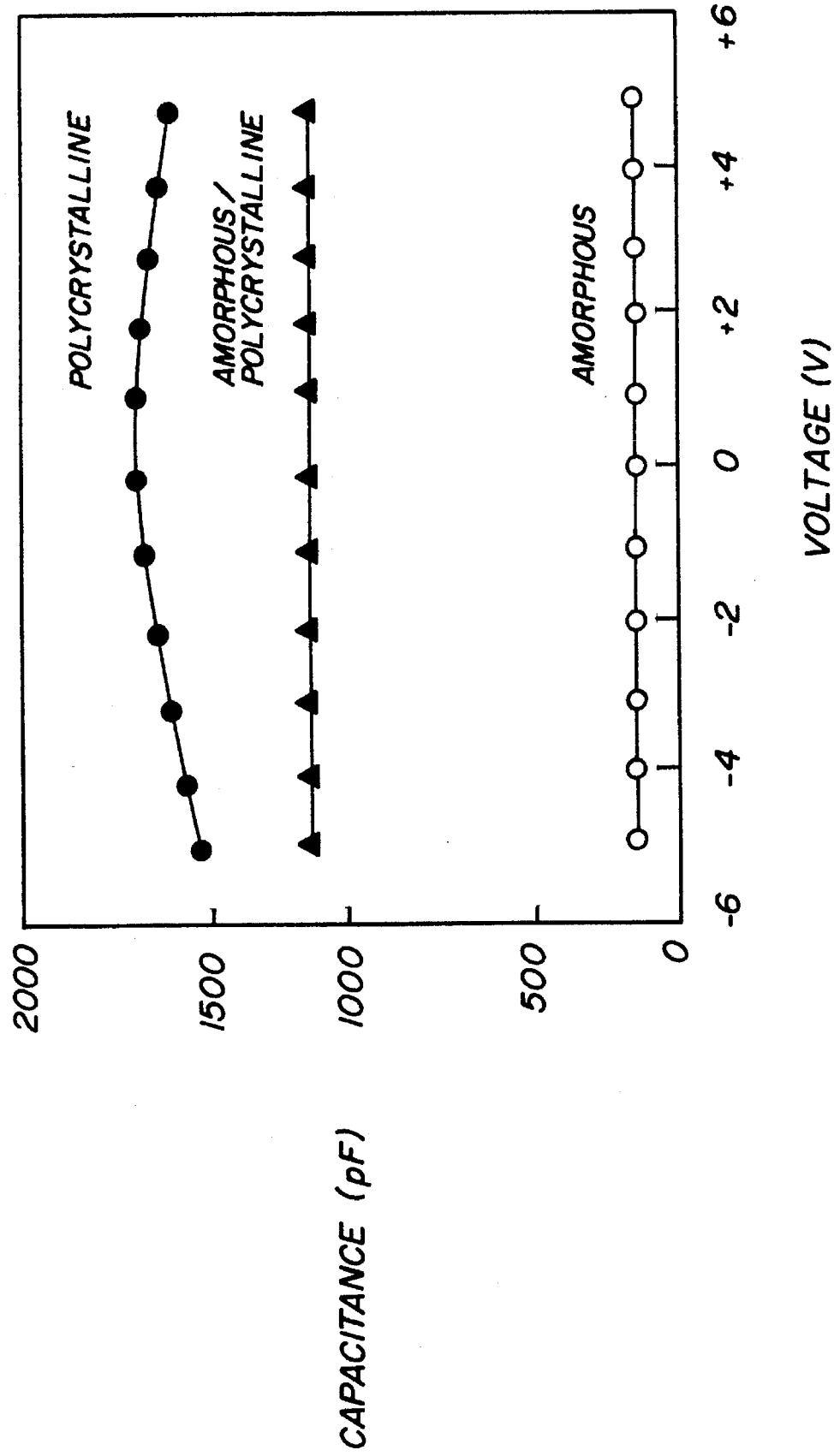
FIG. 6 is a correlation diagram, depicting capacitance vs voltage characteristics, of amorphous $BaTiO_3$, polycrystalline $BaTiO_3$ and dual polycrystalline/amorphous $BaTiO_3$ layered capacitors having a metal-dielectric-metal structure.

FIG. 6 illustrates the correlation between capacitance and voltage characteristics of amorphous, polycrystalline and a dual amorphous/polycrystalline layer metal-dielectric-metal capacitor. The data clearly demonstrate the high capacitance the polycrystalline film as having voltage dependent high capacitance, that is capacitance decreases with increases in voltage. The amorphous and the dual layered species, to the contrary, clearly demonstrate voltage independent characteristics.

Figure 7:
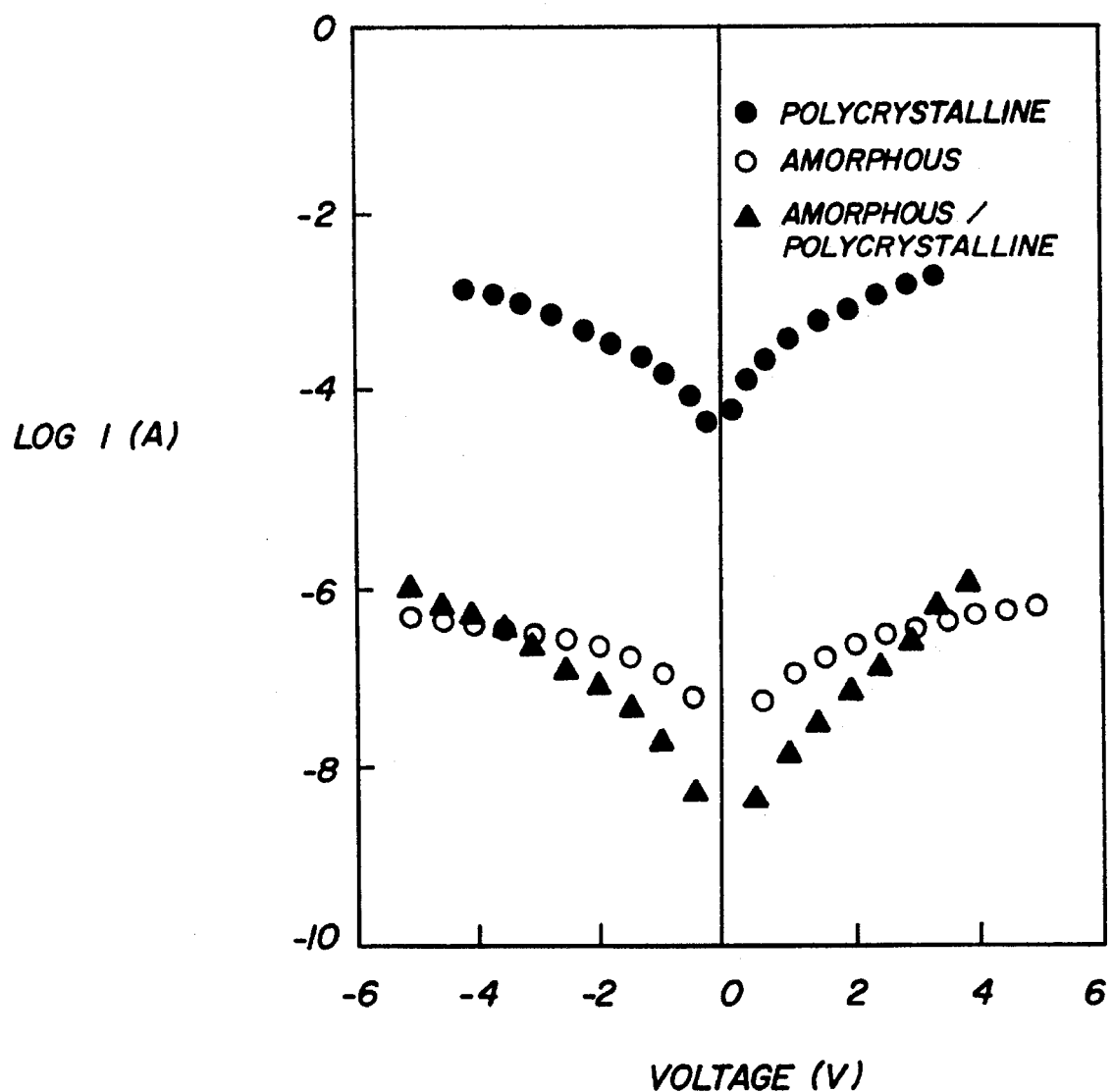
FIG. 7 is a correlation graph, depicting leakage current vs voltage characteristics, of amorphous $BaTiO_3$, polycrystalline $BaTiO_3$ and dual polycrystalline/amorphous $BaTiO_3$ layered capacitors having a metal-dielectric-metal structure.

FIG. 7 illustrates the current-voltage correlation of amorphous, polycrystalline and double amorphous/polycrystalline layer metal-dielectric-metal capacitors. The data clearly demonstrate the double layer as more closely following the desirable response of an amorphous layer than the undesirable response of a polycrystalline layer.

FIG. 8 comprises tabulated data from $BaTiO_3$ dielectric capacitors made with amorphous (A), polycrystalline (P), amorphous-on-polycrystalline (A/P), polycrystalline-on-amorphous (P/A) and amorphous-on-polycrystalline-on-amorphous (A/P/A) layered metal-dielectric-metal (MIM) and metal-dielectric-semiconductor-metal (MIS) type structures. Unless otherwise identified, MIM type structures comprise palladium metal electrodes.

The arrangement of dielectric film layers in a capacitor is tabulated under Layers and the recitation A, P, A/P, P/A and A/P/A is as above identified. Each layer was formed in accord with the processes of FIGS. 3–7. The overall depth of the deposited dielectric film is in angstroms.

Layers reciting A/G/P designate the presence of a gradient layer which was purposely formed, using the processes of FIGS. 3–7, by depositing the dielectric within the high temperature range of above about 540° Centigrade (for polycrystalline formation) and, while continuing deposition, gradually decreasing the temperature to about room temperature (for amorphous formation). A generally consistent polycrystalline layer was deposited at the high temperature range, while, as the temperature gradually lowered below about 520° Centigrade, a gradient layer formed comprising increasing nanocrystalline or quasi-amorphous dielectric which became a generally consistent amorphous deposition as the temperature dropped to room temperature.

Layers reciting A:H designate an amorphous layer deposited in accord with FIGS. 3–7 but using an argon atmosphere containing 5% hydrogen.

Layers reciting $A/RuO_2$, $P/RuO_2$ and $A/P/RuO_2$ had both electrodes made from $RuO_3$ metallic oxide. $P/SiO_2$ layers had a bottom dielectric, 200 angstroms thick made from $SiO_2$, a bottom electrode of Si and an upper electrode made from aluminum. $P/A/RuO_2$ and $A/P/A/RuO_2$ layers had a lower electrode made from $RuO_2$ metallic oxide and an upper electrode made from gold.

Table 1 sets out the thickness of each layer comprising the overall dielectric deposition of layers tabulated in FIG. 8.

In FIG. 8, $\epsilon_r$ is the effective dielectric constant of the dielectric layer(s) relative to air; $V_{BD}$ is the breakdown voltage of the dielectric layer(s) in volts/cm units; $\sigma$ is the conductivity of the dielectric layer(s) in ohms/cm$^{-1}$ units; $J(=I/A)$ is the dc leakage current density at 4 volts in amperes/cm$^2$ units; and C/A is the capacitance per unit area in picofarads/cm$^2$ units.

FIGS. 10–14 provide correlation data relating to various trilayer embodiments of the invention. In fabricating the capacitors to obtain the data, silicon semiconductor substrates that were used, were treated with buffered hydrofluoric acid to remove native oxides and cleaned with trichlorethylene, acetone, methanol and deionized water, to remove surface impurities prior to formation of the dielectric film. Metal electrodes were also cleaned.

The layers of amorphous, nanocrystalline, polycrystalline and amorphous $BaTiO_3$ dielectric material were deposited sequentially. The only changeable parameter during sputtering was the substrate temperature. An amorphous layer was deposited at the desired room temperature for an amount of time which depended upon film thickness. The nanocrystalline layer was next formed by shutting off the power supply to the substrate heater and permitting gradual cooling of the substrate during deposition. A thickness of around 15–20 nm was estimated for the nanocrystalline layer, since the substrate temperature could be reduced to less than 500° C. within 5 minutes from shutting off the power supply to the substrate heater. The polycrystalline material was deposited at 700° C. The sputtering was continued until a substrate temperature in the range of 20°–300° was reached forming an amorphous layer.

Figure 10:
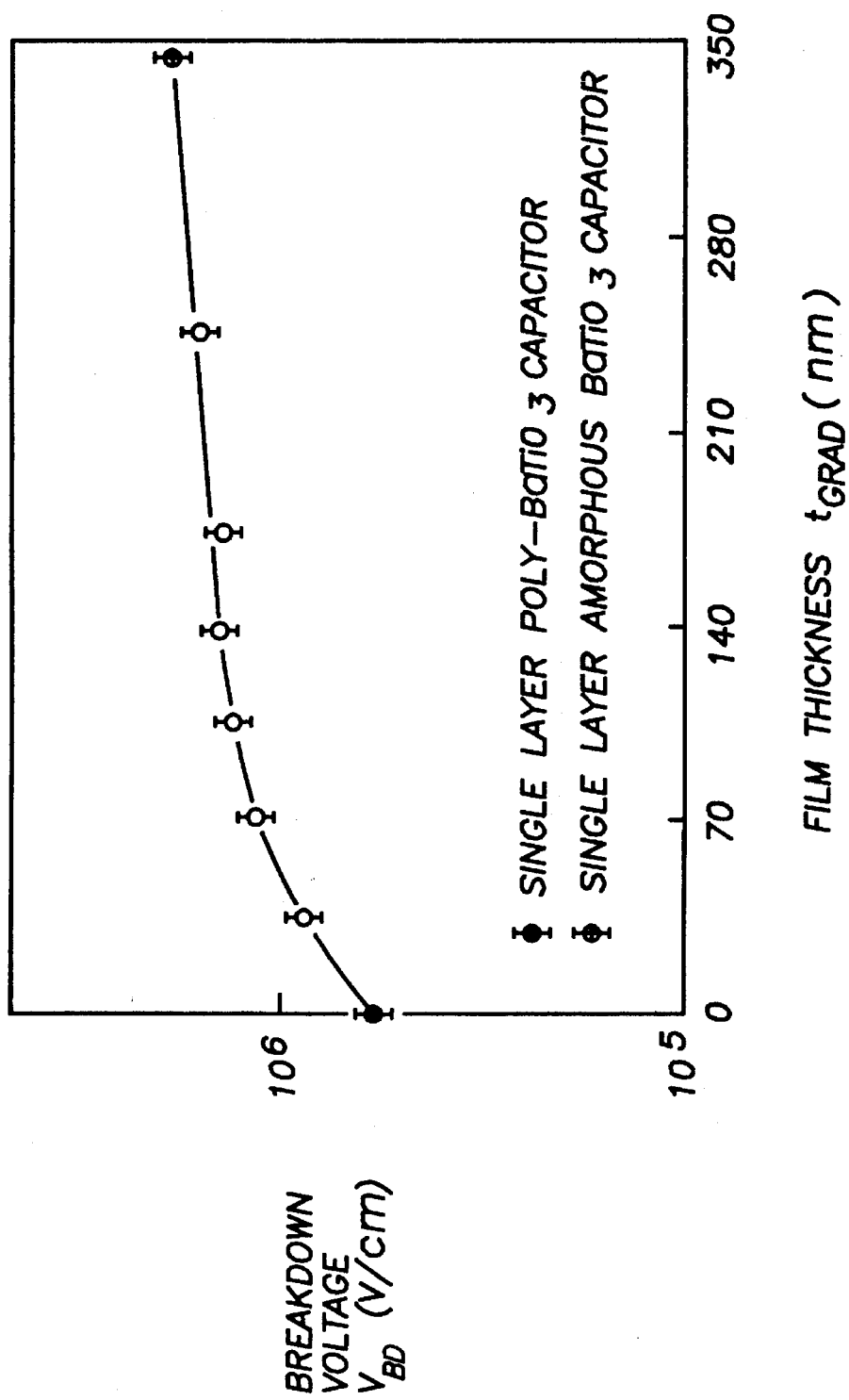
FIG. 10 is a correlation graph, depicting breakdown voltage vs film thickness, of a trilayer capacitor wherein the polycrystalline film was deposited at 700° C.

FIG. 10 shows the relationship between $V_{BD}$ and $t_{grad}$ wherein $t_{grad}$ is the nanocrystalline layer. As can be seen from this figure, $V_{BD}$ for the trilayer configuration is comparable with that of single-layer amorphous configurations as long as the nanocrystalline layer is greater than 250 nm.

Figure 11:
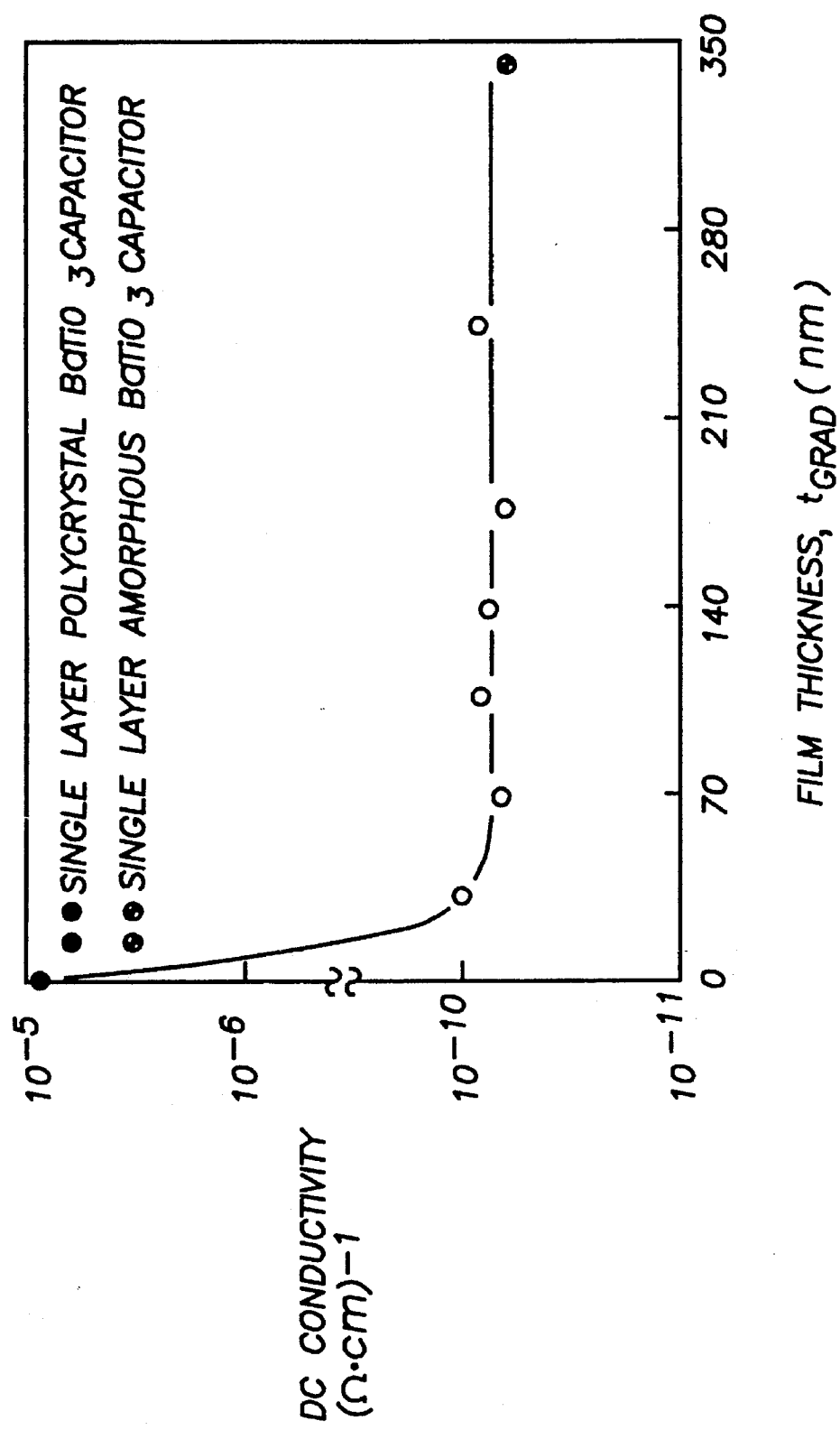
FIG. 11 is a correlation graph, depicting DC conductivity vs film thickness, of a trilayer capacitor wherein the polycrystalline film was deposited at 700° C.

FIG. 11 shows the relationship between $\delta_{eff}$ of the capacitor and $t_{grad}$. $\delta_{eff}$ was again comparable with that of the single layer amorphous capacitor as long as $t_{grad}$ was greater than 70 nm. $\delta_{eff}$ could be reduced five orders of magnitude (at a bias voltage of 4 V) compared with the single layer polycrystalline capacitors as long as $t_{grad}$ exceeded 70 nm.

Figure 12:
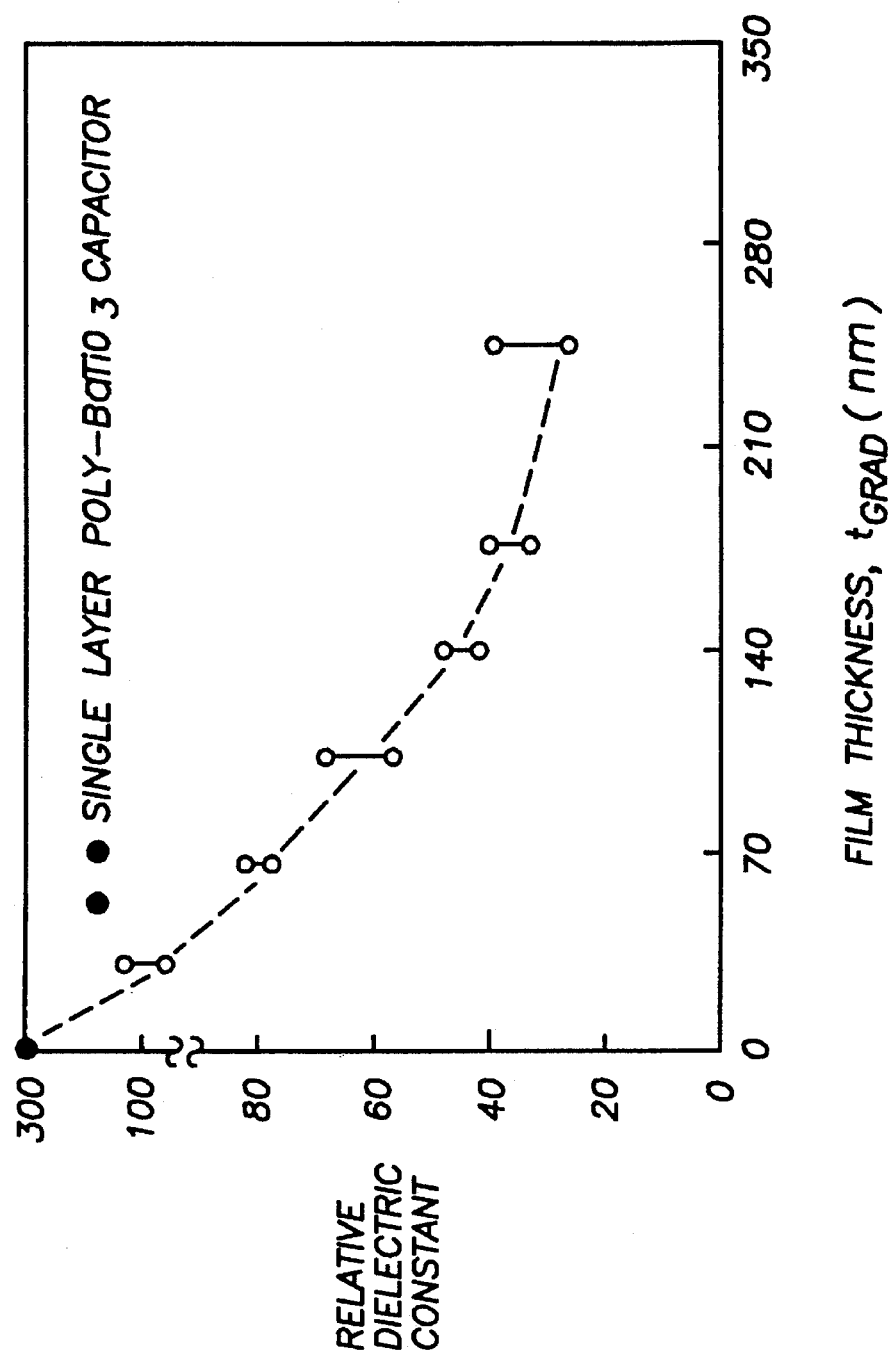
FIG. 12 is a correlation graph, depicting relative Dielectric constant vs film thickness, of a trilayer capacitor wherein the polycrystalline film was deposited at 700° C.

FIG. 12 shows the $t_{grad}$ dependent $\delta_{eff}$. $\delta_{eff}$ was around 25–40 when $t_{grad}$ was 250 nm. The higher $\delta_{eff}$ for a trilayer capacitor was around 130 at about 35 nm of nanocrystalline layer but at 80 for about 70 nm of nanocrystalline layer, wherein the polycrystalline layers were deposited at 700 C.

Figure 13:
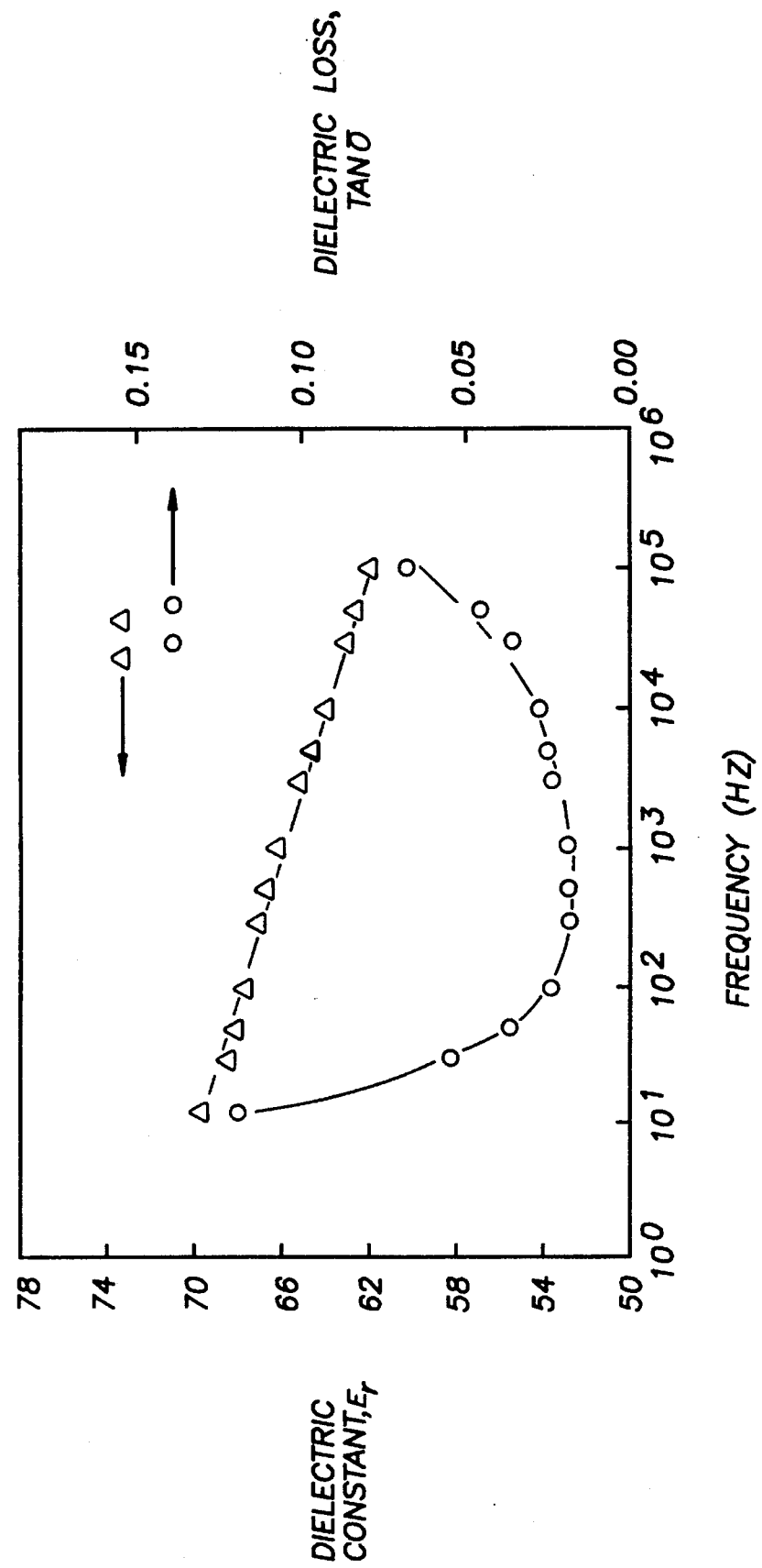
FIG. 13 is a correlation graph, depicting Dielectric Constant vs Frequency for a trilayer capacitor of the invention.

FIG. 13 shows the typical frequency-dependent $\delta_{eff}$ and tan $\delta$ curves for a trilayer capacitor. $\delta_{eff}$ also exhibits a monotonic decrease with increasing frequency, however the minimum tan $\delta$ occurs at a lower frequency.

Figure 14:
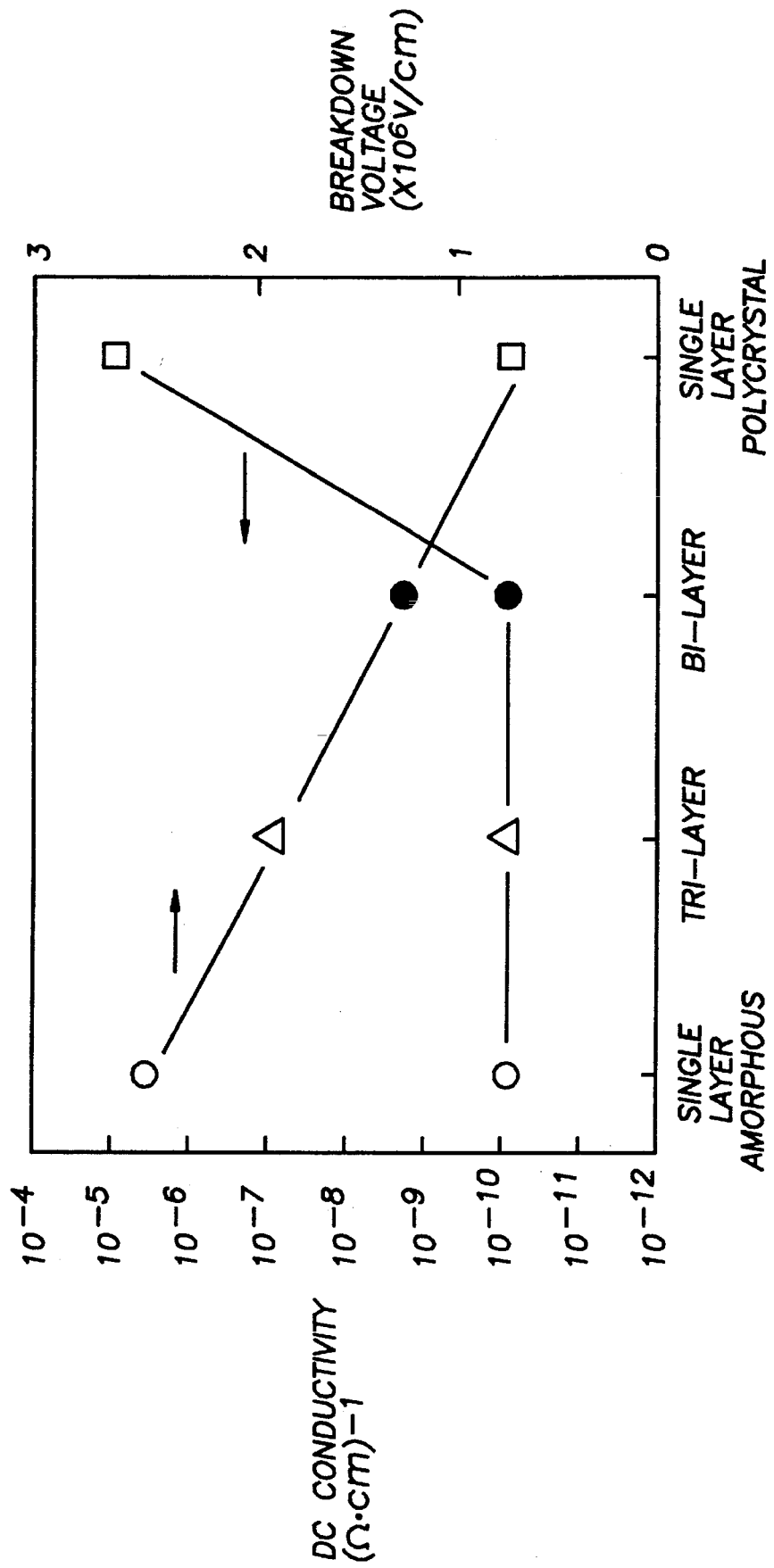
FIG. 14 is a correlation graph, depicting DC Conductivity vs Breakdown Voltage for a trilayer capacitor of the invention.

FIG. 14 shows the most important parameters of D.C. Conductivity and Breakdown Voltage for $BaTiO_3$ thin film capacitors with different structures. The trilayer capacitor appears as a highly favorable choice because of the avoidance of abrupt change in the electrical field.

Figure 15:
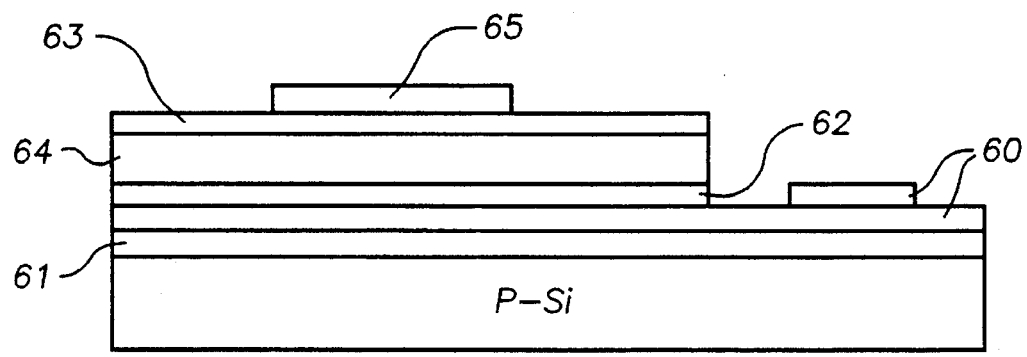
FIG. 15 is a sectional view of a semiconductor capacitive element embodiment having a multilayer configuration of the invention.

FIG. 15 is a sectional view of a planer capacitor configuration of the invention wherein the components are arranged in a trilayer metal-dielectric-semi-conductor-metal structure. Therein, the structure comprises metal lower electrode 60, engaging semiconductor 61. Electrode 60 has formed thereon a thin film nanocrystalline layer 62, a polycrystalline thin film layer 64, and a thin film amorphous layer 63. Engaging amorphous layer 63 is metal upper electrode 65.

Figure 16:
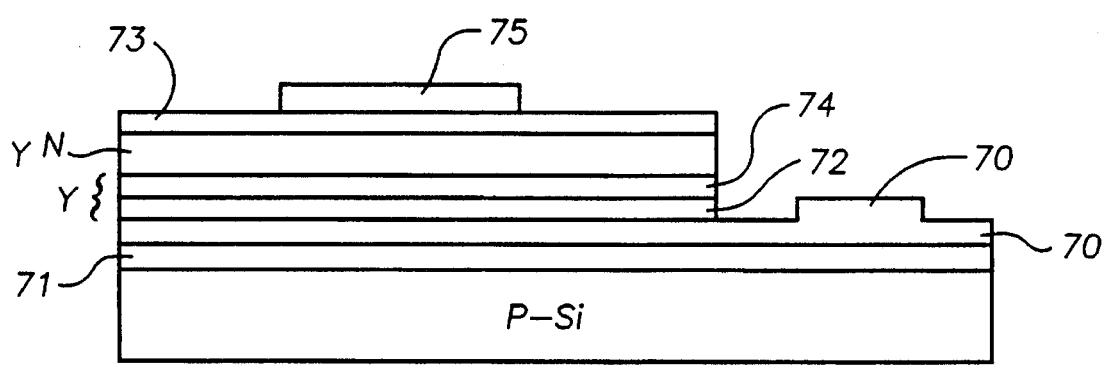
FIG. 16 is a sectional view of a further semiconductor capacitive element embodiment having a multilayer configuration of the invention.

FIG. 16 is a sectional view of a planer capacitor configuration of the invention wherein the components are arranged in a multilayer metal-dielectric-semi-conductor-metal structure. Therein, the structure comprises metal lower electrode 70, engaging semiconductor 71. Electrode 70 has formed thereon a thin film nanocrystalline layer 72 and a polycrystalline thin film layer 74, the two layers being designated a unit Y. The area designated $Y^n$ comprises n units of Y, meaning multiple nanocrystalline and polycrystalline stacked layers. Thin film amorphous layer 73 engages metal upper electrode 75.

Figure 17:
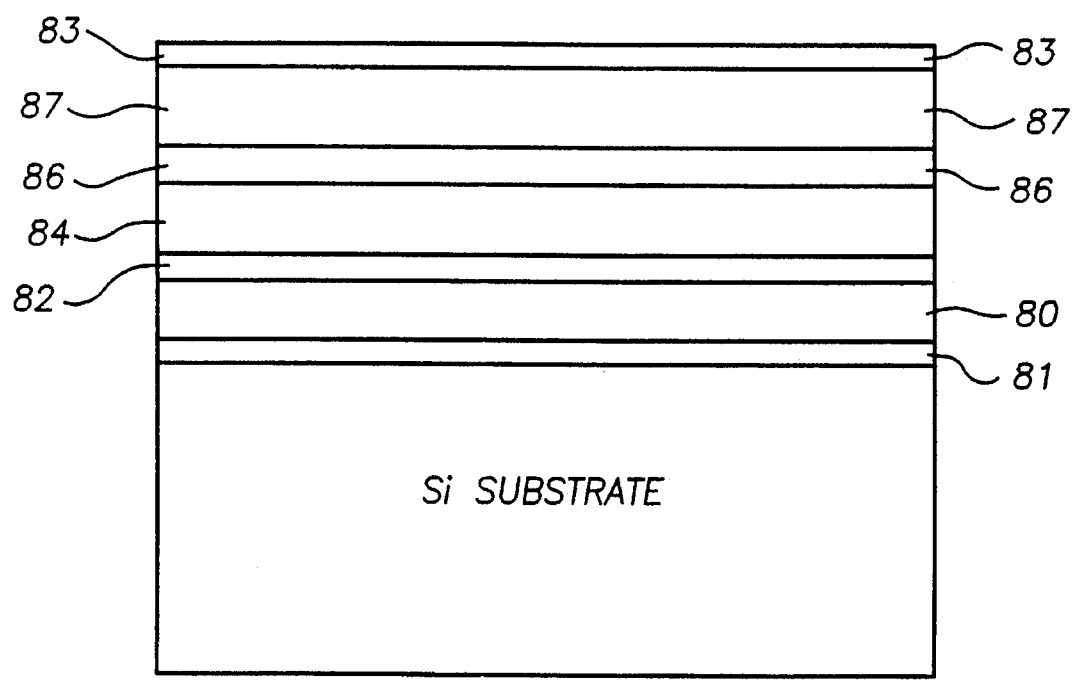
FIG. 17 is a sectional view of a further semiconductor capacitive element embodiment having a multilayer configuration of the invention.

FIG. 17 is a sectional illustration of a planer capacitor configuration of the invention wherein the components are arranged in a multilayer metal-dielectric-semiconductor-metal structure. Therein, the structure comprises metal lower $RuO_2$ bottom electrode 80, engaging $SiO_2$ semiconductor 81. Electrode 80 has formed thereon a thin film nanocrystalline layer 82, a polycrystalline thin film layer 84, a further nanocrystalline layer 86, a further polycrystalline layer 87 and amorphous layer 83. Layers 84 and 87 comprise grain-boundary dislocation, or cluster.

TABLE 1

| Layers | Thick | A | G | P | A |
|---|---|---|---|---|---|
| P | 4840 | — | — | 4840 | — |
| A | 5000 | 5000 | — | — | — |
| A/P | 5050 | 200 | — | 4850 | — |
| A/G/P | 9670 | 200 | 600 | 8870 | — |
| A/G/P | 4462 | 200 | 600 | 3662 | — |
| A/G/P | 4190 | 100 | 350 | 3640 | — |
| A/G/P | 1450 | 100 | 200 | 1150 | — |
| A:H | 2500 | 2500 | — | — | — |
| P/SiO$_2$ | 900 | — | — | 900 | — |
| A/RuO$_2$ | 2460 | 2460 | — | — | — |
| P/RuO$_2$ | 2730 | — | — | 2730 | — |
| A/P/RuO$_2$ | 2200 | 450 | — | 1750 | — |
| P/A/RuO$_2$ | 1995 | 600 | — | 1395 | — |
| A/P/A/RuO$_2$ | 2280 | 100 | — | 1520 | — |

We claim:

1. A method for preparing a dielectric article comprising forming a dielectric material into film layers arranged in opposing juxtaposition, a first layer comprising said dielectric material in amorphous configuration, a second film layer comprising said dielectric material in polycrystalline configuration and a third layer comprising said dielectric material in nanocrystalline configuration, and arranging said opposing layers between upper and lower electrodes.

2. The method of claim 1 wherein said dielectric article is arranged in a semiconductor substrate structure.

3. The method of claim 2 wherein a layer of said dielectric material is formed on said semiconductor substrate structure; another layer is formed on said layer formed on said semiconductor substrate structure; a further layer is formed on said another layer; an upper electrode is arranged in electrical communication with said further layer; and a lower electrode is arranged in electrical communication with said semiconductor substrate.

4. The method of claim 3 wherein said a layer is formed on at least one of said electrodes which is arranged in electrical communication with said semiconductor substrate structure; another layer is formed on said layer formed on said electrode; a further layer is formed on said another layer and an upper electrode is arranged in electrical communication with said further layer.

5. The method of claim 4 wherein said a layer is a nanocrystalline layer formed by crystallizing an amorphous layer on said electrode.

6. The method of claim 3 wherein said a layer is a nanocrystalline layer formed by crystallizing an amorphous layer on said substrate.

7. The method of claim 2 wherein said semiconductor substrate structure comprises a material selected from the group consisting of Si, SiC, GaAs, CdS, ZnO and ZnS.

8. The method of claim 1 wherein said polycrystalline layer of said dielectric material is formed on a surface of said nanocrystalline layer of said dielectric material.

9. The method of claim 1 wherein said amorphous layer of said dielectric material is formed on a surface of said polycrystalline layer of said dielectric material.

10. The method of claim 1 wherein said nanocrystalline layer of said dielectric material is formed through nanocrystallization of said amorphous layer of said dielectric material.

11. The method of claim 1 wherein said dielectric material is selected from the group consisting of $BaTiO_3$, $SrTiO_3$, $KNO_3$, $LiNbO_3$, $Bi_4Ti_3O_{12}$, $PbTiO_3$, $PbZrO_3$, $LaTiO_3$, $PbMgO_3$, $PbNbO_3$ and $LaZrO_3$.

12. The method of claim 11 wherein at least one film layer is formed by rf magnetron sputtering.

13. The method of claim 1 wherein at least one of said electrodes comprises a material selected from the group consisting of aluminum, copper, gold, silver, platinum, lead, ruthenium and palladium.

14. The method of claim 1 wherein at least one dielectric film layer is formed by a method selected from the group consisting of rf magnetron sputtering, vacuum evaporation, laser ablation, metal-organic chemical vapor deposition and E-beam evaporation.

15. The method of claim 14 wherein said polycrystalline film layer is formed at a temperature from about 540° Centigrade to about 1,000° Centigrade.

16. The method of claim 1 wherein said polycrystalline film layer is formed at a temperature above about 540° Centigrade.

17. The method of claim 1 wherein said amorphous film layer is formed at a temperature below about 350° Centigrade.

18. The method of claim 17 wherein said amorphous film is formed at a temperature from about room temperature to about 350° Centigrade.

19. The method of claim 1 wherein said nanocrystalline film layer is formed at a temperature above about 540° Centigrade.

20. The method of claim 19 wherein said nanocrystalline film layer is formed at a temperature from about 350° Centigrade to about 700° Centigrade.

21. The method of claim 1 wherein said polycrystalline film layer is formed to a thickness of from about 400 to about 10,000 angstroms.

22. The method of claim 21 wherein said polycrystalline film layer is formed to a thickness of from about 1,500 to about 3,500 angstroms.

23. The method of claim 1 wherein said amorphous film layer is formed to a thickness of from about 100 to about 2,000 angstroms.

24. The method of claim 23 wherein said amorphous film layer is formed to a thickness of from about 150 to about 600 angstroms.

25. The method of claim 1 wherein said nanocrystalline layer is formed by changing temperature conditions during deposition of said dielectric material.

26. The method of claim 25 wherein said polycrystalline layer is formed by deposition of a dielectric at a temperature above about 540° Centigrade and the temperature is lowered during deposition so as to deposit a nanocrystalline layer on the polycrystalline layer.

27. The method of claim 25 wherein said amorphous layer is formed by deposition of a dielectric at a temperature below about 400° Centigrade, the temperature is raised and the amorphous layer is crystallized so as to form a nanocrystalline layer, and a polycrystalline layer is thereafter deposited on the nanocrystalline layer.

28. The method of claim 1 comprising a further amorphous layer in opposing juxtaposition to said polycrystalline layer.

29. The method of claim 1 comprising a further nanocrystalline layer in opposing juxtaposition to said polycrystalline layer.

30. The method of claim 1 comprising a further polycrystalline layer in opposing juxtaposition to said nanocrystalline layer.

31. A high performance capacitor comprising film layers of a dielectric material arranged in opposing juxtaposition, one said layer comprising said dielectric in amorphous configuration, another of said layers comprising said dielectric material in nanocrystalline configuration and a further layer comprising said dielectric material in polycrystalline configuration, said opposing layers being arranged between upper and lower electrodes.

32. A capacitor of claim 31 comprising a semiconductor substrate structure.

33. A capacitor of claim 32 wherein a first layer engages a semiconductor substrate; another layer engages said first layer; a further layer engages said another layer; an upper electrode is arranged in communication with said further layer; and a lower electrode is arranged in electrical communication with said semiconductor substrate.

34. A capacitor of claim 32 wherein a first layer engages an electrode which is arranged in electrical communication with said semiconductor substrate structure; another layer engages said first layer; a further layer engages said another layer, and an upper electrode is arranged in electrical communication with said further layer.

35. A capacitor of claim 32 wherein said semiconductor substrate structure comprises a material selected from the group consisting of Si, SiC, GaAs, CdS, ZnO and ZnS.

36. A capacitor of claim 31 wherein said dielectric material is selected from the group consisting of $BaTiO_3$, $SrTiO_3$, $KNO_3$, $LiNbO_3$, $Bi_4Ti_3O_{12}$, $PbTiO_3$, $PbZrO_3$, $LaTiO_3$, $PbMgO_3$, $PbNbO_3$ and $LaZrO_3$.

37. A capacitor of claim 31 wherein at least one electrode comprises a material selected from the group consisting of aluminum, copper, gold, silver, platinum, lead, ruthenium and palladium.

38. A capacitor of claim 31 wherein at least one dielectric film layer is formed by a method selected from the group consisting of rf magnetron sputtering, vacuum evaporation, laser ablation, metal-organic chemical vapor deposition and E-beam evaporation.

39. A capacitor of claim 31 wherein said polycrystalline film is from about 400 to about 10,000 angstroms thick.

40. A capacitor of claim 31 wherein said amorphous film is from about 100 to about 2,000 angstroms thick.

41. A capacitor of claim 31 wherein said nanocrystalline film is from about 100 to about 2,000 angstroms thick.

42. A capacitor of claim 41 wherein said nanocrystalline layer is formed by nanocrystallization of an amorphous layer of the dielectric material.

43. A capacitor of claim 31 comprising a further amorphous layer in opposing juxtaposition to said polycrystalline layer.

* * * * *